United States Patent [19]

Tomita et al.

[11] Patent Number: 4,946,752
[45] Date of Patent: Aug. 7, 1990

[54] FLEXOGRAPHIC CURED PRINTING PLATE COMPRISING A CHLORINATED POLYMER AND A HYDROPHILIC POLYMER

[75] Inventors: Akira Tomita; Toshihiko Kajima; Keizo Kawahara; Hiroshi Satomi, all of Ohtsu, Japan

[73] Assignee: Toyo Boseki Kabushiki Kaisha, Osaka, Japan

[21] Appl. No.: 285,368

[22] Filed: Dec. 15, 1988

Related U.S. Application Data

[63] Continuation of Ser. No. 137,120, Dec. 23, 1987, abandoned.

[30] Foreign Application Priority Data

Dec. 27, 1986 [JP] Japan ............................... 61-315218
Jan. 28, 1987 [JP] Japan ............................... 62-19490
Oct. 22, 1987 [JP] Japan ............................... 62-267678

[51] Int. Cl.$^5$ .......................... G03C 1/68; G03C 1/22
[52] U.S. Cl. .................................. 430/18; 430/306; 430/286; 430/907; 430/287; 430/284; 522/109; 522/110
[58] Field of Search ................. 430/306, 286, 907, 18, 430/281, 287; 522/109, 110

[56] References Cited

U.S. PATENT DOCUMENTS

| | | | |
|---|---|---|---|
| 3,764,324 | 10/1973 | Reyes | 430/306 X |
| 4,058,443 | 11/1977 | Murata | 204/159.17 |
| 4,265,986 | 5/1981 | Allen et al. | 430/306 X |
| 4,272,608 | 6/1981 | Proskow | 430/286 X |
| 4,601,973 | 7/1986 | Bauer | 430/280 |

FOREIGN PATENT DOCUMENTS 2179360 3/1987 United Kingdom ............... 430/306

*Primary Examiner*—Paul R. Michl
*Assistant Examiner*—Cynthia Hamilton
*Attorney, Agent, or Firm*—Wegner & Bretschneider

[57] ABSTRACT

A photosensitive resin composition for a flexographic printing plate which comprises:
(A) a polymer having a chlorine content of 10 to 50% by weight and a glass transition temperature of not higher than 5° C. provided that the polymer is other than that of a conjugated diene hydrocarbon and a copolymer thereof;
(B) a hydrophilic polymer;
(C) an ethylenic unsaturated compound; and
(D) a photopolymerization initiator.

8 Claims, No Drawings

FLEXOGRAPHIC CURED PRINTING PLATE COMPRISING A CHLORINATED POLYMER AND A HYDROPHILIC POLYMER

This application is a continuation of U.S. application Ser. No. 137,120, filed Dec. 23, 1987, now abandoned.

FIELD OF THE INVENTION

The present invention relates to a photosensitive resin composition having rubber-like elasticity which can be developed with an aqueous system. Particularly, the photosensitive resin composition of the present invention is suitable for a flexographic printing plate.

BACKGROUND OF THE INVENTION

Hitherto, as photosensitive resin plates for flexographic printing, plates of photosensitive resin compositions which are developed with organic solvents have been known. However, these printing plates have problems of safety for the human body and environment due to use of organic solvents, for example, toxicity, flammability and the like.

In view of this, recently, it has been proposed to use flexographic printing plates of photosensitive resin composition which can be developed with an aqueous system instead of the above plates.

For example, Japanese Patent Kokai No. 52-134655 discloses a photosensitive resin composition which comprises a copolymer containing as essential components a conjugated diene hydrocarbon and a $\alpha\beta$- ethylenic unsaturated carboxylic acid and also containing a monoolefin unsaturated compound, as well as a photopolymerizable unsaturated monomer and a photosensitizer. Japanese Patent Kokai No. 60-211451 discloses a photosensitive elastomer composition which comprises as essential components a conjugated diene hydrocarbon polymer or a copolymer of a conjugated diene hydrocarbon and a monoolefin unsaturated compound, a hydrophilic polymer, a non-gaseous ethylenic unsaturated compound and a photopolymerization initiator.

These compositions can be developed by an aqueous developing solution, for example, an aqueous alkali solution or an aqueous alkali-organic solvent system. However, the compositions have problems that their ozone resistance, weathering resistance and oxidation resistance which are required for a flexographic printing plate are insufficient because their bases are conjugated diene hydrocarbons Further, the fundamental characteristic property of a photosensitive resin composition is an optical property, namely, light transmission property and, therefore, good compatibility between components is required. In this respect, because many of hydrophilic polymers to be contained in such a composition have originally high polarity, preferably, other components to be mixed also have high polarity. However, generally, polymers of conjugated diene hydrocarbons have low polarity and therefore they have a defect that the kind and the mixing ratio of a hydrophilic polymer having good compatibility are limited.

In Japanese Patent Kokai No. 62-133449, there is disclosed a photosensitive resin composition which can be developed with an aqueous system. This composition comprises (A) a water soluble polymer and its photocrosslinking agent or a photo-crosslinkable water soluble polymer and (B) a copolymer the main copolymerizable components of which are vinylidene chloride and (meth)acrylic acid and/or a (meth)acrylic acid derivative. However, this composition is used for a screen printing plate and there is no suggestion of a flexographic printing plate.

OBJECTS OF THE INVENTION

Under these circumstances, the present inventors have studied intensively to solve the above problems in a photosensitive resin composition for a flexographic printing plate which can be developed with an aqueous system. As the result, it has been found that the desired photosensitive resin composition can be obtained by using a certain polymer containing no conjugated hydrocarbon and a hydrophilic polymer as a base polymer. It has been also found that the resulting composition has improved resistance to an aqueous ink.

The main object of the present invention is to provide a photosensitive resin composition for a flexographic printing plate which can be developed with an aqueous system and has excellent ozone resistance, weathering resistance and oxidation resistance as well as improved resistance to an aqueous ink.

This object as well as other objects and advantages of the present invention will become apparent to those skilled in the art from the following description.

SUMMARY OF THE INVENTION

According to the present invention, there is provided a photosensitive resin composition for a flexographic printing plate which comprises:

(A) a polymer having a chlorine content of 10 to 50% by weight and a glass transition temperature of not higher than 5° C. provided that the polymer is other than that of a conjugated diene hydrocarbon and a copolymer thereof:

(B) a hydrophilic polymer:

(C) an ethylenic unsaturated compound: and (D) a photopolymerization initiator.

The photosensitive resin composition of the present invention can be developed with an aqueous system. Because the structure of the base polymer does not contain a carbon-carbon unsaturated bond in the chlorine containing polymer main chain, the composition of the present invention has excellent ozone resistance, weathering resistance and the like comparing with a conventional composition wherein a conjugated diene rubber is used as its base polymer. Further, the composition of the present invention has excellent compatibility with the hydrophilic polymer. Furthermore, it has good oil resistance oil.

DETAILED DESCRIPTION OF THE INVENTION

The component (A) of the present invention, the polymer having a chlorine content of 50 to 10% by weight and a glass transition temperature (hereinafter abbreviated as Tg) of not higher than 5° C. can be obtained by polymerization of a monomer containing one or more chlorine atoms, or copolymerization of a monomer containing one or more chlorine atoms and another copolymerizable monomer. The component (A) can be also obtained by reaction of a chlorine or a chlorine containing active material and a polymer containing no chlorine atom. Examples of the polymer include epichlorohydrin polymer, epichlorohydrin-ethylene oxide copolymer, epichlorohydrin-propylene oxide copolymer, epichlorohydrin rubber which is a copolymer of allyl glycidyl ether and the above polymer or copolymer [e.g., the commercially available epichlorohydrin "EPICHLOMER" manufactured by Daiso Epichlo Rubber Co., Ltd., Japan; "HYDRIN" manufactured by Goodrich Inc., U.S.A.: "GECHRON" and "ZEOSPAN" manufactured by Nippon Zeon Co., Ltd., Japan; or "HERCLOR" manufactured by Hercules Inc., U.S.A.] and chlorinated polyolefin such as chlorinated polyethYlene [e.g. commercially available chlorinated polyethylene "ELASLEN" manufactured by Showa Denko Kabushiki Kaisha, Japan; "DAISO-LAC" manufactured by Osaka Soda Co., Ltd.; "HORTALITZ" manufactured by Hoechst Inc., West Germany; or "DOW CPE" manufactured by Dow Chemical Inc., U.S.A.], vinylchloride copolymer, chlorinated polypropylene, chlorinated ethylene-propylene rubber and the like. These polymers can be used alone, or in combination thereof.

The chlorine content of polymer (A) in the present invention is 10 to 50% by weight. When the content is out of this range, it is not preferred because flexibility and heat stability are impaired and thereby a photosensitive resin composition becomes too hard and is liable to be colored. By the way, because a polymer or copolymer of conjugated diene hydrocarbon containing chlorine atoms has carbon-carbon unsaturated bonds in its main chain, chemical stability such as weathering resistance or the like is inferior to that of a polymer having only saturated bonds. Further, because the property of a photosensitive resin composition after irradiation of light depends greatly upon the nature of the component (A) in the present invention, it is preferred that the component (A) has substantially rubber-like elasticitY. For that reason, its Tg should be be not higher than 5° C., particularly, not higher than −10° C.

In the present invention, an elastomer having good compatibility with the above polymer component (A) and having ozone resistance, for example, acrylic rubber, polyurethane elastomer or the like can be blended with the polymer.

The amount of the component (A) in the composition of the present invention is preferably not less than 20% by weight, particularly, not less than 30% by weight in view of properties and shape retention of a printing plate obtained by using the composition. On the other hand, in view of photopolymerizability, the amount of the component (A) is preferably not more than 80% by weight, particularly not more than 70% by weight.

The component (B), the hydrophilic polymer, of the present invention is a polymer which can dissolve or swell (disperse) in water or a developing solution containing water as a main component and an aqueous alkaline solution, an aqueous acid solution, an organic solvent, a surfactant or the like.

For example, there can be used polymers having hydrophilic groups such as hydroxy group, carboxyl group, amino group, sulfone group and the like and/or polyoxyalkylene chain. Specific examples thereof include polyvinyl alcohol, carboxymethylcellulose, hydroxyethylcellulose, water-soluble polyurethane, water-soluble polyureaurethane, water-soluble polyester, water-soluble epoxy compound, carboxyl group containing acrylonitrile-butadiene copolymer, carboxyl group containing styrene-butadiene copolymer, carboxyl group containing polybutadiene, polyacrylamide, sodium polyacrylate, polyurethane having hydrophilic groups such as carboxyl group and the like, carboxyl group containing polyureaurethane, polyamic acid, polyisoprene and the like. Although the present invention is not limited thereto, preferably the polymer has, per 1,000,000 g of Polymer B, 50 to 50000 polar groups represented by the formula -COOM wherein M is hydrogen atom, alkali metal or ammonium, and from 3 to 20% by weight of polyoxyalkylene chain. Further, in order to improve resistance to an aqueous ink of a relief part after photopolymerization, it is preferred to introduce ethylenic unsaturated bonds into a terminal and/or aside chain of the hydrophilic polymer.

The content of the component (B) is preferably 5 to 50% by weight, particularly 7 to 40% by weight in view of developability with an aqueous system and resistance to an aqueous ink.

The component (C) in the present invention, the ethylenic unsaturated compound, contains at least one terminal ethylenic group, and this compound can form a polymer by chain growth addition polymerization initiated by a free radical. Suitable ehtylenic unsaturated compounds are unsaturated esters of polyols, particularly unsaturated esters of α-methylene carboxylic acids. Specific examples thereof include ethylene glycol di(meth)acrylate, diethylene glycol di(meth)acrylate, glycerol diacrylate, 1,3-propanediol di(meth)acrylate, 1,4-butanediol di(meth)acrylate, 1,2,4-butanetriol tri(meth)acrylate, 1,4-cyclohexanediol di(meth)acrylate, 1,6-hexanediol di(meth)acrylate, trimethylolpropane tri(meth)acrylate diallyl phthalate, diethyl fumarate ester, dibutyl maleate, or N-substituted maleimide compound such as N-methyl maleimide, N-ethyl maleimide, N-lauryl maleimide and the like, oligo (meth)acrylate such as oligo nitrile butadiene di(meth)acrylate, oligo nitrile urethane (meth)acrylate, oligo urethane di(meth)acrylate, oligo butadiene di(meth)acrylate, oligo butadiene urethane di(meth)acrylate and the like. These may be used alone or in combination. The term "(meth)acrylate" means both acrylate and methacrylate.

The content of the component (C) in the composition is preferably 1 to 50% by weight. When the content is less than 1% by weight, no image remains after developing because of a hindrance in photopolymerizability On the other hand, when the content is higher than 50% by weight, shape retention is damaged. Further, when the content is too high, a plate after light irradiation becomes unsuitable for a flexographic printing plate because of hardness and brittleness. The preferred content is 5 to 40% by weight.

As the component (D) of the present invention, the photopolymerization initiator, there can be used benzophenones, benzoins, acetophenones, benzils, benzoin alkyl ethers, benzil alkyl ketals, anthraquinones, thioxanthones and the like. Specific examples thereof include benzophenone, chlorobenzophenone, benzoin, acetophenone, benzil, benzoin methyl ether, benzoin ethyl ether, benzoin isopropYl ether, benzoin isobutyl ether, benzil dimethyl ketal, benzil diethyl ketal, benzil diisopropyl ketal, anthraquinone, 2-chloroanthraquinone, thioxanthone, 2-chlorothioxanthone and the like.

The initiator is contained in the composition in the amount of 0.01 to 5% by weight. When the amount is less than 0.01% by weight, potency of photopolymerization initiation is damaged. When the amount is higher than 5% by weight, it is not preferred because suitable curing depth can not be obtained by light shading due to the composition itself and the image is liable to disappear by developing. The preferred amount is 0.1 to 3% by weight.

In the present invention, optionallY, a heat polymerization-inhibitor (E) can be contained in the composition in the amount of from 0.001 to 5% by weight in addition to the above components (A) to (D) in order to prevent only heat polymerization without inhibiting photocrosslinking reaction. Examples of useful heat polymerization-inhibitors include hydroquinone, hydroquinone monoethyl ether, catechol, p-t-butylcatechol, 2,6-di-t-butyl-p-cresol and the like.

The photosensitive resin composition of the present invention can further contain as a plasticizer a depolymerized rubber such as depolymerized polybutadiene rubber, depolymerized polyacrylonitrile butadiene rubber, depolymerized polystyrene butadiene rubber, depolymerized isoprene rubber or the like, an elastomer having a relatively low molecular weight such as polyvinyl chloride, chlorinated polyethylene, chlorinated polypropylene or the like, finely divided powder such as silica, diatomaceous earth or the like.

The photosensitive resin composition of the present invention can be prepared by admixing the components in an appropriate order according to a known method. The composition can also be prepared by dissolving the above component in a suitable solvent, for example, tetrahydrofuran, dioxane, methyl ethyl ketone, cyclohexanone, chloroform or the like in an optional order, and, if necessary, removing the solvent.

By using the photosensitive resin composition of the present invention, a flexographic printing plate can be prepared by contact bonding the composition on the surface of a suitable support, for example, a film such as that of polyester, polyethylene, polypropylene or the like with heating after removing a solvent, if the composition contains a solvent. A similar film or a film prepared by coating or laminating a thin membrane which is soluble in an aqueous developing solution, for example, a film of polyvinyl alcohol, polyacrylamide, hydroxypropylcellulose or the like can be provided on the surface of the photosensitive resin composition layer.

As ultraviolet rays to be used for curing a photosensitive resin plate of the composition of the present invention, those of the wavelength of 150 to 500 m$\mu$, particularly 300 to 400 m$\mu$ are effective. As a light source, preferably, there can be used low pressure mercury lamp, high pressure mercury lamp, carbon arc lamp, fluorescent light lamp, chemical lamp, xenon lamp, zirconium lamp. In order to obtain a relief image, ultraviolet rays are irradiated using the above light source on a photosensitive resin plate of the composition of the present invention overlaid with a negative film having a transparent image to expose the composition to light, and then a non-image part which is not exposed to light is removed using a developing solution.

The developing solution can contain as the main component tap water and can also contain an alkaline compound such as sodium hydroxide, sodium carbonate or the like, a surfactant, a water-soluble organic solvent, etc.

The temperature of the developing solution is preferably 25° C. to 45° C.

The photosensitive resin plate of the composition of the present invention has a rubber-like elasticity, and is useful for a flexographic printing plate. And, it has excellent resistance to ink, ink transfer property and resistance to printing. By the way, although the photosensitive resin composition of the present invention is mainly useful for a flexographic printing plate, it is also applicable to photoresist and sandblast, and can be used as an elastomer which is curable by ultraviolet rays, for example, an adhesive, a film, a paint and the like.

The following Preparations, Examples and Comparative Examples further illustrate the present invention in detail but are not to be construed to limit the scope thereof.

All the "parts" in Preparations, Examples and Comparative Examples are by weight unless otherwise stated.

Hardness, impact resilience and ozone resistance of a flexographic printing plate from the composition of the present invention were determined as follows.

Hardness: Hardness was measured at 20° C. by the spring type hardness test (A type) method according to JIS-K6301.

Impact resilience: A steel ball of 10 m/m $\phi$ (weight: 4.16 g) was fallen from 20 cm height to read a bounce height (a), and impact resilience was expressed as (a/20)×100%.

Ozone resistance: A test piece of 5×20×1 mm was allowed to stand under ozone atmosphere (1 ppm, 1 m$^3$/min.) at 25° C. for 24 hours, and ozone resistance was expressed as hardness at that timet, and it was compared with that of immediately after preparation of the test piece.

SYNTHESIS OF HYDROPHILIC POLYMERS

Preparation 1

A solution of 21.8 parts of hexamethylene diisocyanate, 15.4 parts of dimethylol propionic acid and 7.6 parts of polytetramethylene glycol (PG-100 manufactured by Nippon Polyurethane Ind. Co., Ltd., Japan) in 300 parts of methyl ethyl ketone was placed in a 1 l flask equipped with a stirrer. A solution was prepared by dissolving 55.3 parts of a terminal amino group containing acrylonitrile butadiene oligomer (Hycar ATBNX 13600×16 manufactured by Ube Industries Ltd., Japan) in 100 parts of methyl ethyl ketone in a separate container. The solution was added to the above 1 l flask at room temperature while stirring. One part of dilauric acid di-n-butyltin was added, and the flask was heated at 70° C. for 3 hours while continuing stirring. The resulting polymer solution was dried under reduced pressure to remove methyl ethyl ketone to obtain a hydrophilic polymer [I] having a number-average molecular weight of 45000.

Preparation 2

To a solution of 100 parts of the hydrophilic polymer [I] obtained in Preparation 1 in 100 parts of methyl ethyl ketone wa added dropwise a solution of 4.8 parts of lithium hydroxide in 100 parts of methyl alcohol at room temperature while stirring, and the mixture was stirred for an additional 30 min. to obtain a hydrophilic polymer [II].

Preparation 3

A solution of 84.9 parts of hexamethylene diisocyanate, 44.3 parts of dimethylol propionic acid, 21.0 parts of polytetramethylene glycol (PG-100 manufactured by Nippon Polyurethane Ind. Co., Ltd., Japan), 5.0 parts of dilauric acid di-n-butyltin dissolved in 160 parts of tetrahYdrofuran was placed in a 1 l flask equipped with a stirrer. The flask was headet at 65° C. while continuing stirring, the reaction was continued for 3 hours, and an additional 18.3 parts of hydroxyethyl methacrylate was added. The mixture heated at 65° C. to react for 2 hours.

A solution was prepared by dissolving 132 parts of a terminal amino group containing acrylonitrile butadiene oligomer (Hycar ATBNX 1300 x 16 manufactured by Ube Industries Ltd., Japan) in 200 parts of methyl ethyl ketone and 100 parts of tetrahydrofuran in a separate container. This solution was added to the above 1 l flask while stirring. The resulting polymer solution was dried under reduced pressure to remove tetrahydrofuran and methyl ethyl ketone to obtain a hydrophilic polymer [III] having a number-average molecular weight of 20000.

Preparation 4

To a hydrophilic polymer [III]obtained in Preparation 3 was added 4.6 parts of lithium hydroxide according to the same manner as described in Preparation 2 to obtain a hydrophilic polymer [IV].

Preparation 5

A solution of 20 parts of a terminal amino group containing propylene oxide oligomer (JEFFAMINE D-2000 manufactured by Jefferson Chemical Inc., U.S.A.) in 30 parts of tetrahydrofuran was added to a solution of 4.4 parts of anhydrous pyromellitic acid previously dissolved in 20 parts of tetrahydrofuran at room temperature while stirring.

To a solution obtained by dissolving 36 parts of a terminal amino group containing acrylonitrile butadiene oligomer (Hycar ATBNX 1300×16 manufactured by Ube Industries Ltd., Japan) in a mixed solvent of 100 parts of tetrahydrofuran and 50 parts of methanol was added the above reaction solution of the propylene oxide oligomer and anhydrous pyromellitic acid at room temperature while stirring to obtain a solution of polyamic acid. After casting this solution, it was dried to remove the solvents under reduced pressure to obtain a hydrophilic polymer [V].

Preparation 6

200 Parts of a copolymer of isobutylene and maleic anhydride (ISOBAN D-4 manufactured by Kuraray Kabushiki Kaisha, Japan), 400 parts of methanol and 3 parts of 2-methylimidazole were placed in a flask equipped with a reflux condenser and a stirrer to react at 64° C. for 8 hours. The reaction solution was cast, dried under reduced pressure to obtain a hydrophilic polymer [VI].

EXAMPLES 1 TO 24 AND COMPARATIVE EXAMPLES 1 AND 2

According to the formulations as shown in Table 1, by using as the base polymers the polymer (A), the hydrophilic polymer (B) and the ethylenic unsaturated compound (C) as well as the photopolymerization initiator (E), dimethylbenzil ketal (1 part) and hydroquinone monomethyl ether (0.5 part), a photosensitive resin composition was prepared by kneading and mixing them at 105° C. with a heated kneader, and then deaerating.

The resulting photosensitive resin composition was heat pressed between a polyester film 125 μm in thickness and the same film coated with polyvinyl alcohol 2 μm in thickness on one side at 105° C. under pressure of 100 kg/cm² for 1 minute using a heat press so that the coated polyvinyl alcohol layer is contacted with the photosensitive resin to form a printing plate of 2.8 mm in thickness.

The uppermost polyester film was peeled off so that the polyvinyl alcohol membrane remained on the photosensitive resin layer, and a negative film having an image was contacted on the membrane to expose to light at illumination of 25 W/m² for 5 minutes using a mercury lamp (manufactured by Dainippon Screen Mfg. Co., Ltd., Japan). After removing a negative film, the plate was developed at 40° C. for 10 minutes with a 0.5% (by weight) aqueous sodium hydroxide solution by using a brush.

The properties of the resulting printing plate are also shown in Table 1.

TABLE 1

| | Base polymers | | | | | | Ethylenic unsaturated compound | (part) |
|---|---|---|---|---|---|---|---|---|
| | (A) Polymer | (part) | (B) Hydrophilic polymer | (part) | Others | (part) | | |
| Example 1 | EPICHLOMER H | 50 | hydrophilic polymer [I] | 15 | styrene butadiene rubber | 10 | butadiene oligoacrylate | 28.5 |
| Example 2 | " | 50 | hydrophilic polymer [II] | 10 | — | | butadiene oligoacrylate glycidyl methacrylate | 23.5 5.0 |
| Example 3 | " | 50 | hydrophilic polymer [III] | 10 | — | | butadiene oligoacrylate | 28.5 |
| Example 4 | " | 50 | hydrophilic polymer [IV] | 10 | — | | " | 28.5 |
| Example 5 | " | 50 | hydrophilic polymer [V] | 20 | — | | " | 28.5 |
| Example 6 | " | 55 | hydrophilic polymer [VI] | 15 | — | | monoacrylate of phenol ethylene oxide adduct hexamethylene diacrylate | 20 8.5 |
| Example 7 | " | 50 | methacrylic acid acrylonitrile butadiene copolymer | 25 | — | | monoacrylate of phenol ethylene oxide adduct hexamethylene diacrylate | 13.5 10 |
| Example 8 | HYPALON-40 | 50 | hydrophilic polymer [I] | 15 | styrene butadiene rubber | 10 | butadiene oligoacrylate | 28.5 |
| Example 9 | ELASLEN-301A | 50 | hydrophilic polymer [I] | 15 | styrene butadiene rubber | 10 | " | 28.5 |
| Example 10 | HYPALON-40 | 50 | hydrophilic polymer [V] | 10 | — | | butadiene oligoacrylate glycidyl methacrylate | 23.5 5.0 |
| Example 11 | ELASLEN-301A | 50 | hydrophilic polymer [V] | 10 | — | | butadiene oligoacrylate glycidyl methacrylate | 23.5 5.0 |
| Example 12 | HYPALON-40 | 50 | hydrophilic polymer [IV] | 10 | — | | butadiene oligoacrylate | 28.5 |
| Example 13 | ELASLEN-301A | 50 | hydrophilic polymer [IV] | 10 | — | | " | 23.5 |
| Example 14 | EPICHLOMER HG | 50 | hydrophilic polymer [V] | 10 | — | | " | 28.5 |

TABLE 1-continued

| | | | | | | | |
|---|---|---|---|---|---|---|---|
| Example 15 | HYDRIN 200 | 50 | hydroxypropyl methylcellulose | 20 | — | | acrylonitrile butadiene oligoacrylate and monoacrylate of phenol ehtylene oxide adduct | 28.5 |
| Example 16 | EPICHLOMER H | 25 | hydrophilic polymer [III] | 10 | ethylene propylene rubber | 25 | butadiene oligoacrylate | 28.5 |
| Example 17 | HYPALON-20 | 50 | hydrophilic polymer [IV] | 10 | — | | butadiene oligoacrylate | 28.5 |
| Example 18 | ELASLEN-301A | 50 | hydrophilic polymer [II] | 10 | — | | butadiene oligoacrylate glycidyl methacrylate | 23.5 5.0 |
| Example 19 | HYPALON-20 | 10 | hydrophilic polymer [IV] | 10 | styrene butadiene rubber | 50 | butadiene oligoacrylate glycidyl methacrylate | 23.5 5.0 |
| Example 20 | HYPALON-20 | 10 | hydrophilic polymer [IV] | 10 | styrene butadiene styrene block copolymer | 50 | butadiene oligoacrylate glycidyl methacrylate | 23.5 5.0 |
| Example 21 | EPICHLOMER H | 50 | a lithium carboxyl chloride group containing polyisoprene | 10 | — | | butadiene oligoacrylate | 28.5 |
| Example 22 | HYPALON-20 | 10 | a lithium carboxyl chloride group containing polyisoprene | 10 | styrene butadiene styrene block copolymer | 50 | " | 28.5 |
| Example 23 | EPICHLOMER H | 50 | a sodium carboxyl chloride group containing polyisoprene | 10 | — | | " | 28.5 |
| Example 24 | HYPALON | 50 | a sodium carboxyl chloride group containing polyisoprene | 10 | — | | " | 28.5 |
| Comparative Example 1 | HYCAR 1014 | 50 | hydrophilic polymer [I] | 15 | styrene butadiene rubber | 10 | butadiene oligoacrylate | 28.5 |
| Comparative Example 2 | NIPOL 1507 | | hydrophilic polymer [I] | 15 | styrene butadiene rubber | 10 | | |

| | Developing depth (mm) | Shore A hardness (°) | Impact resilience (%) | Resistance to ozone (°) | Shape | Degree of swelling (%) water | Degree of swelling (%) ethanol |
|---|---|---|---|---|---|---|---|
| Example 1 | 1.2 | 63 | 28 | 63 | not changed | 1.4 | 5.3 |
| Example 2 | 1.3 | 57 | 35 | 57 | " | 2.1 | 5.7 |
| Example 3 | 2.0 | 56 | 35 | 56 | " | 1.5 | 5.5 |
| Example 4 | 1.2 | 57 | 35 | 57 | " | 2.3 | 5.8 |
| Example 5 | 1.0 | 55 | 25 | 55 | " | 2.1 | 5.9 |
| Example 6 | 1.1 | 60 | 25 | 60 | " | 1.7 | 5.5 |
| Example 7 | 1.0 | 60 | 25 | 61 | " | 2.0 | 5.8 |
| Example 8 | 1.1 | 63 | 35 | 63 | " | 1.3 | 5.1 |
| Example 9 | 1.0 | 58 | 30 | 58 | " | 2.2 | 5.5 |
| Example 10 | 1.1 | 55 | 33 | 55 | " | 1.8 | 5.7 |
| Example 11 | 1.6 | 54 | 24 | 54 | " | 2.2 | 5.6 |
| Example 12 | 1.1 | 60 | 33 | 60 | " | 2.0 | 5.9 |
| Example 13 | 1.2 | 60 | 28 | 60 | " | 2.1 | 5.8 |
| Example 14 | 1.3 | 55 | 27 | 56 | " | 2.0 | 5.7 |
| Example 15 | 1.0 | 65 | 28 | 65 | " | 2.4 | 6.2 |
| Example 16 | 1.8 | 56 | 30 | 55 | " | 1.2 | 5.8 |
| Example 17 | 1.4 | 55 | 30 | 55 | " | 2.1 | 5.5 |
| Example 18 | 1.4 | 53 | 35 | 53 | " | 2.8 | 5.3 |
| Example 19 | 1.1 | 55 | 35 | 55 | " | 2.2 | 5.6 |
| Example 20 | 1.2 | 57 | 35 | 57 | " | 2.1 | 5.8 |
| Example 21 | 1.1 | 55 | 30 | 55 | " | 2.3 | 5.7 |
| Example 22 | 1.0 | 53 | 30 | 53 | " | 2.2 | 5.6 |
| Example 23 | 1.1 | 53 | 35 | 53 | " | 2.3 | 5.9 |
| Example 24 | 1.1 | 55 | 35 | 55 | " | 1.9 | 5.8 |
| Comparative Example 1 | 0.3 | 60 | 30 | 65* | shrinkage 50% | 2.9 | 9.5 |
| Comparative Example 2 | 0.4 | 57 | 28 | 65* | shrinkage 50% | 2.8 | 8.3 |

*The surface was hardened, and a crack occurred when bent.
The polymers used in Table 1 are as follows.
EPICHLOMER H: polyepichlorohydrin
HYDRIN 200: an equimolar copolymer of epichlorohydrin and ethylene oxide
EPICHLOMER HG: copolymer of 92 mol % of epichlorohydrin and 8 mol % of allylglycidyl ether
HYPALON-40: chlorosulfonated polyethylene
HYPALON-20: chlorosulfonated polyethylene
ELASLEN-301A: chlorinated polyethylene
HYCAR 1014: copolymer of 21% of acrylonitrile and 79% of butadiene
NIPOL 1507: copolymer of 23.5% of styrene and 76.5% of butadiene

What is claimed is:

1. A flexographic printing plate comprising the cured reaction product of an aqueous developable photosensitive resin composition which comprises:
   (A) epichlorohydrin rubber;
   (B) a hydrophilic polymer;
   (C) an ethylenic unsaturated compound; and
   (D) a photopolymerization initiator.

2. A flexographic printing plate comprising the cured reaction product of an aqueous developable photosensitive resin composition which comprises:
   (A) A polymer having a chlorine content of 10 to 50% by weight and a glass transition temperature of not higher than 5° C. provided that the polymer is other than that of a conjugated diene hydrocarbon and a copolymer thereof;
   (B) a hydrophilic polymer having a polar group represented by the formula -COOM wherein M is a hydrogen atom, an alkali metal or ammonium, and a polyoxyalkylene chain;
   (C) an ethylenic unsaturated compound; and
   (D) a photopolymerization initiator.

3. A flexographic printing plate comprising the cured reaction product of an aqueous developable photosensitive resin composition which comprises:
   (A) a polymer having a chlorine content of 10 to 50% by weight and a glass transition temperature of not higher than 5° C. provided that the polymer is other than that of a conjugated diene hydrocarbon and a copolymer thereof;
   (B) a hydrophilic polymer having, per $10^6$ g thereof, 50 to 50000 polar groups represented by the formula —COOM wherein M is a hydrogen atom, an alkali metal, or ammonium, and a polyoxyalkylene chain;
   (C) an ethylenic unsaturated compound; and
   (D) a photopolymerization initiator.

4. A flexographic printing plate comprising the cured reaction product of an aqueous developable photosensitive resin composition which comprises:
   (A) a polymer having a chlorine content of 10 to 50% by weight and a glass transition temperature of not higher than 5° C. provided that the polymer is other than that of a conjugated diene hydrocarbon and a copolymer thereof;
   (B) a hydrophilic polymer which has 3 to 20% by weight of a polyoxyalkylene chain;
   (C) an ethylenic unsaturated compound; and
   (D) a photopolymerization initiator.

5. A flexographic printing plate according to claim 4, wherein polymer (A) is chlorinated polyolefin.

6. A flexographic printing plate according to claim 4, wherein the composition contains 20 to 80% by weight of the polymer (A).

7. A flexographic printing plate according to claim 4, wherein the composition contains 1 to 50% by weight of the ethylenic unsaturated compound.

8. A flexographic printing plate according to claim 4, wherein the composition contains 0.01 to 5% by weight of the photopolymerization initiator.

* * * * *